US011761998B2

(12) United States Patent
Paul et al.

(10) Patent No.: US 11,761,998 B2
(45) Date of Patent: Sep. 19, 2023

(54) METHOD FOR DETERMINING A CONDUCTIVITY VALUE

(71) Applicant: Endress+Hauser Conducta GmbH+Co. KG, Gerlingen (DE)

(72) Inventors: Stefan Paul, Döbeln (DE); Thomas Nagel, Dresden (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 0 days.

(21) Appl. No.: 17/931,207

(22) Filed: Sep. 12, 2022

(65) Prior Publication Data
US 2023/0078394 A1    Mar. 16, 2023

(30) Foreign Application Priority Data
Sep. 10, 2021  (DE) .................... 10 2021 123 443.3

(51) Int. Cl.
*G01N 27/02* (2006.01)
*G01R 27/22* (2006.01)

(52) U.S. Cl.
CPC .................................. *G01R 27/22* (2013.01)

(58) Field of Classification Search
CPC ........ G01R 27/02; G01R 27/22; G01R 27/04; G01N 27/04; G01N 27/041; G01N 27/045
See application file for complete search history.

(56) References Cited

U.S. PATENT DOCUMENTS

| 4,300,094 A * | 11/1981 | Piso ..................... G01N 27/041 73/160 |
| 5,394,084 A * | 2/1995 | Snyder ................ G01N 27/023 324/656 |
| 9,797,854 B1 * | 10/2017 | Silva ........................ G01B 7/06 |
| 2007/0055463 A1 * | 3/2007 | Florenz ................ G01F 23/266 702/50 |
| 2008/0282808 A1 * | 11/2008 | Trieu ....................... G01F 1/712 73/861.27 |
| 2017/0269015 A1 * | 9/2017 | Günther ............... G01N 27/025 |

FOREIGN PATENT DOCUMENTS

| DE | 19814763 A1 | 10/1999 |
| DE | 10161069 A1 | 6/2003 |
| DE | 10161072 A1 | 6/2003 |
| DE | 10259719 A1 | 7/2004 |

* cited by examiner

*Primary Examiner* — Thang X Le
(74) *Attorney, Agent, or Firm* — Kelly J. Smith; Endress+Hauser (USA) Holding, Inc.

(57) ABSTRACT

The present disclosure relates to a method for determining a conductivity value of a measurement medium using a conductivity sensor. The method includes providing a conductivity sensor with at least one transmitting unit, at least one receiving unit, and a control unit having a storage module, and transmitting a stimulation signal into the measurement medium at the transmitting unit by the control unit. The method also includes receiving a detection signal at the receiving unit, determining a signal quality indicator by the control unit based on the detection signal, and determining a conductivity signal corresponding to the detection signal. The method further includes storing the conductivity signal, determining a dynamic factor by the control unit based on the conductivity signal, filtering the conductivity signal using a filter function depending on the determined signal quality indicator and the dynamic factor, and outputting a filtered measured value of the filtered conductivity signal.

9 Claims, 2 Drawing Sheets

METHOD FOR DETERMINING A CONDUCTIVITY VALUE

CROSS-REFERENCE TO RELATED APPLICATION

The present application is related to and claims the priority benefit of DPMA Patent Application No. 10 2021 123 443.3, filed on Sep. 10, 2021, the entire contents of which are incorporated herein by reference.

TECHNICAL FIELD

The present disclosure relates to a method for determining a conductivity value, and to a conductivity sensor.

BACKGROUND

In analytical measurement technology, such as in the fields of water management; of environmental analysis; in industry, for example in food technology, biotechnology, and pharmaceutics; as well as for the most varied laboratory applications, measurands, such as the pH value, the conductivity, or even the concentration of analytes, such as ions or dissolved gases in a gaseous or liquid measurement medium, are of great importance. These measurands can be acquired and/or monitored, for example, by means of electrochemical sensors, such as optical, potentiometric, amperometric, voltammetric, or coulometric sensors, or even conductivity sensors.

Given conductivity sensors, such as conductive conductivity sensors, the electrical resistance of a liquid medium is ascertained by measuring at least one electrical variable such as voltage and/or current. Typically, a sinusoidal electrical AC voltage at the electrodes ensures a current flow through the medium. Due to component tolerances, parasitic interference fields around the sensor, and irregularities in the medium to be measured, the measured values are subject to fluctuations. In order to minimize these undesired effects and to obtain a digital output signal that is as low in variation as possible, the determined resistance value or conductivity value is averaged. Depending on the filter depth, thus the size of the values taken into consideration for filtering the mean, the reaction at the filter output is more or less slow to respond to changes in the measured value. A large filter depth entails the disadvantage of a slow response time, but has the advantage of being less influenced by brief interfering influences, for example EMC disturbances. A small filter depth entails the advantage of a rapid response time, but has the disadvantage of being influenced more strongly by brief interfering influences.

SUMMARY

It is therefore an object of the present disclosure to propose a method which enables a rapid response time as well as reliable measurement results.

This object is achieved according to the present disclosure by a method for determining a conductivity value of a measurement medium using a conductivity sensor, as described herein.

The method includes providing a conductivity sensor with at least one transmitting unit, at least one receiving unit, and a control unit having a storage module, and transmitting a stimulation signal into the measurement medium at the transmitting unit by the control unit. The method also includes receiving a detection signal at the receiving unit, determining a signal quality indicator by the control unit based on the detection signal, and determining a conductivity signal corresponding to the detection signal. The method further includes storing the conductivity signal, determining a dynamic factor by the control unit based on the conductivity signal, filtering the conductivity signal using a filter function depending on the determined signal quality indicator and the dynamic factor, and outputting a filtered measured value of the filtered conductivity signal.

Using the method according to the present disclosure, it is possible to respond quickly and qualitatively to unforeseen interfering influences, such as strong EMC influences, so that the measured values of the conductivity signal can be displayed in the best possible manner to the user. Strong fluctuations in the measured values of the conductivity signal are efficiently reduced according to the method of the present disclosure, and thus an improved measurement is made possible to the user.

According to one embodiment of the present disclosure, the step of determining the signal quality indicator includes an evaluation of a distortion of the detection signal compared to the stimulation signal, using at least one evaluation method from the following group: total harmonic distortion evaluation method; cross-correlation evaluation method; fast Fourier transform evaluation method; and signal amplitude evaluation method.

According to one embodiment of the present disclosure, the step of determining the dynamic factor comprises a comparison of a mean value of the stored conductivity signal with the most recent conductivity value of the conductivity signal. The dynamic factor maps a current rate of change of the conductivity signal.

According to one embodiment of the present disclosure, the filter function filters the conductivity signal over a first time span or a first number of measured values of the conductivity signal. The first time span or the first number is varied depending on the signal quality indicator and the dynamic factor.

According to one embodiment of the present disclosure, the first time span or the first number of measured values for the filter function remains the same, or is kept the same, if the signal quality indicator is less than a threshold and if the dynamic factor is less than a first limit value. If the dynamic factor is between the first limit value and a second limit value, the first time span or the first number of measured values for the filter function is reduced by a first reduction proportion RA1. If the dynamic factor is between the second limit value and a third limit value, the first time span or the first number of measured values for the filter function is reduced by a second reduction proportion RA2.

According to one embodiment of the present disclosure, the first time span or the first number of measured values remains the same, or is kept the same, if the signal quality indicator is greater than the threshold and if the dynamic factor is less than a fourth limit value. If the dynamic factor is between the fourth limit value and a fifth limit value, the first time span or the first number of measured values for the filter function is reduced by a third reduction proportion RA3. If the dynamic factor is between the fifth limit value and a sixth limit value, the first time span or the first number of measured values for the filter function is reduced by a fourth reduction proportion RA4.

According to one embodiment of the present disclosure, the filter function includes a moving average filtering.

According to one embodiment of the present disclosure, the stimulation signal includes a periodic alternating current signal or AC voltage signal.

The aforementioned object is likewise achieved by a conductivity sensor according to the present disclosure.

The conductivity sensor according to the present disclosure includes at least one transmitting unit, at least one receiving unit, and a control unit with a storage module.

The control unit is suitable to, or configured to, execute the method according to the present disclosure.

BRIEF DESCRIPTION OF THE DRAWINGS

The present disclosure is explained in more detail on the basis of the following description of Figures. The following are shown.

DETAILED DESCRIPTION

Figure 1:
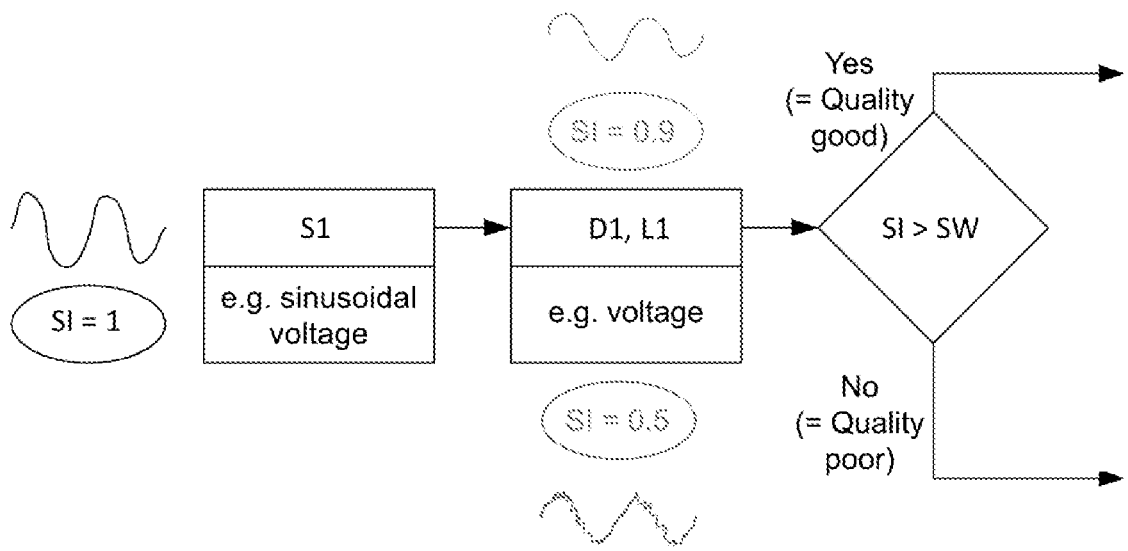
FIG. 1 shows a detail of a schematic representation of the method according to the present disclosure.
Figure 2:
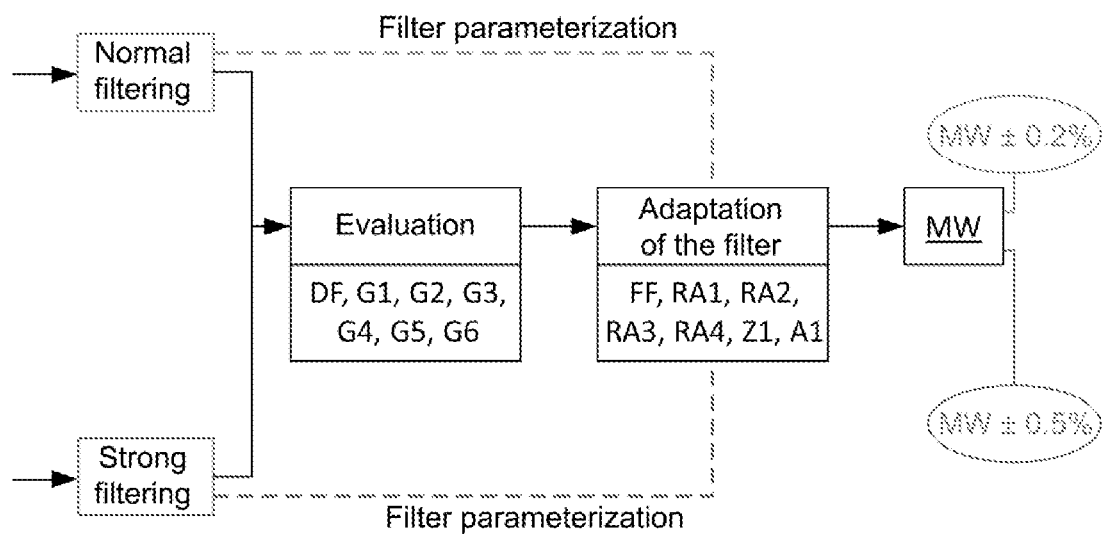
FIG. 2 shows a detail complementary to FIG. 1.
Figure 3:
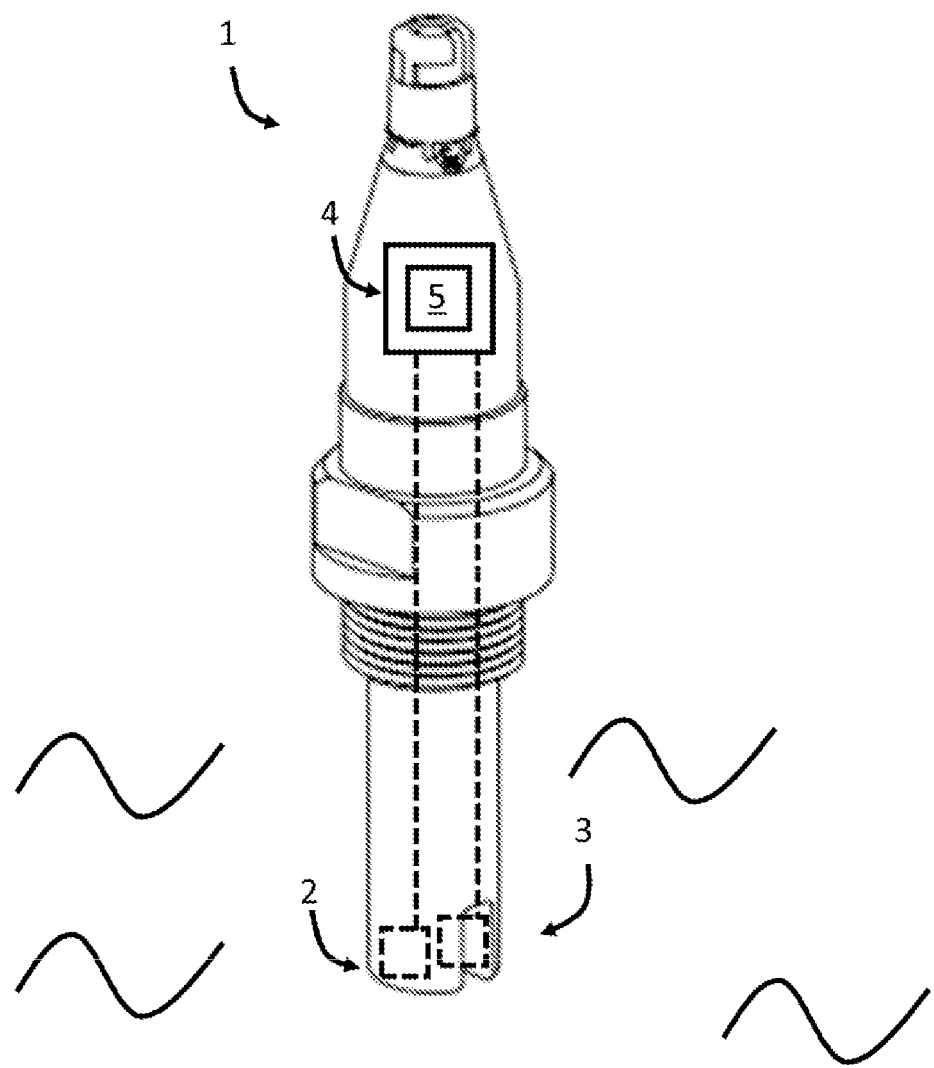
FIG. 3 shows a conductivity sensor.

FIG. 1 and FIG. 2 show the method according to the present disclosure for determining a conductivity value of a measurement medium by means of a conductivity sensor 1. The conductivity sensor 1 is shown in FIG. 3 by way of example as a conductive conductivity sensor 1. However, the method can be similarly applied to, for example, inductive conductivity sensors.

The conductivity sensor 1 comprises at least one transmitting unit 2, at least one receiving unit 3, and a control unit 4 with a storage module 5. The control unit 4 is suitable to execute the method according to the present disclosure. In the embodiment shown in FIG. 3, the transmitter unit 2 is a first electrode and the receiver unit 3 is a second electrode. The storage module 5 is suitable to store values, such as reference values, and to save signals, such as measurement signals.

The method according to the present disclosure is described in the following.

In a first step, the conductivity sensor 1, described above, is provided. The conductivity sensor 1 is exposed to a measurement medium, for example a liquid.

A stimulation signal S1 is then transmitted into the measurement medium at the transmitter unit 2. The stimulation signal S1 is preferably a periodic alternating current signal. The stimulation signal S1 is, for example, sinusoidal, rectangular, or ramp-shaped. The transmission of the stimulation signal S1 occurs via the control unit 4. In the control unit 4, different stimulation signals S1 are preferably saved which are suitable for different measurement media with certain properties. For measurement in ultrapure water, for example, a frequency for the stimulation signal S1 which is less than 100 Hz is selected. For measurement in salt water, for example, a frequency for the stimulation signal S1 which is greater than 1000 Hz is selected. The frequency selected for the stimulation signal S1 depends on the ion mobility of the measurement medium, thus on the conductivity of the measurement medium. At a high frequency of the stimulation signal S1, an accumulation of ions at the electrodes is reduced by the rapid polarization change.

In an optional step, which is compatible with all other mentioned steps, the stimulation signal S1 is stored by the storage module 5 of the control unit 4.

The reception of a detection signal D1 subsequently takes place at the receiving unit 3. The detection signal D1 comprises the stimulation signal S1 influenced by the measurement medium and, under certain circumstances, further interference signals from the environment of the conductivity sensor 1. The detection signal D1 is therefore distorted, for example, compared to the stimulation signal S1, or different in its amplitude or phase or frequency. If a conductive conductivity sensor is involved, the detection signal D1 is a current and/or voltage signal. If an inductive conductivity sensor is involved, the detection signal D1 is a current signal and a voltage signal.

In a next step, the control unit 4 determines a signal quality indicator SI based on the detection signal D1 and/or the stimulation signal S1. This comprises, for example, an evaluation of a distortion of the detection signal D1 compared to the stimulation signal S1. In other words, this is hereby a classification of the quality of the detection signal D1. For example, the stimulation signal S1 has a quality=1 (see FIG. 1). If, for example, the detection signal D1 has hardly any noise, the detection signal D1 has a high quality, i.e., close to 1, for example 0.9 (see FIG. 1, upper sinusoidal signal). Consequently, the stimulation signal S1 was hardly disturbed by the measurement medium, resulting in a low signal quality indicator SI. If the detection signal D1 has a stronger distortion, the detection signal D1 has a less-good quality, i.e., for example, 0.5 (see FIG. 1 lower sinusoidal signal). Given a signal quality indicator SI of 0.5, such as interference frequencies or air bubbles in the measurement medium are present, for example.

The evaluation of the detection signal D1 takes place by means of at least one evaluation method from the following group: total harmonic distortion evaluation method; cross-correlation evaluation method; fast Fourier transform evaluation method; and signal amplitude evaluation method.

The total harmonic distortion (THD) evaluation method comprises a determination of what is known as a distortion factor. The distortion factor provides information about the "cleanness" of a signal. In other words, the distortion factor is a measure of distortions of an originally sinusoidal alternating signal which are caused by non-linear behavior of an assembly or of a device. If the THD evaluation method is used, a sinusoidal signal is preferably used as the stimulation signal S1. Thus, if the distortion factor is low, the signal quality indicator SI is close to the value=1. In this evaluation method, only the detection signal D1 is therefore used.

The cross-correlation evaluation method comprises an assessment of the similarity of the received detection signal D1 to a transmitted stimulation signal S1. Thus, if it is established that the detection signal D1 has a high degree of similarity to the stimulation signal, the signal quality indicator SI is close to the value=1. In this evaluation method, the detection signal D1 and the stimulation signal S1 are therefore used.

The fast Fourier transform evaluation method comprises an analysis of the frequencies present in the detection signal D1. A spectrum of frequencies is determined, and the presence and the level of secondary frequencies are evaluated in addition to the initial frequency of the stimulation signal S1. Secondary frequencies are hereby filtered out by suitable digital filtering methods, and the remaining measurement signal is evaluated. If a small number of secondary frequencies and/or low amplitudes of the secondary frequencies are hereby established, the signal quality indicator SI is close to the value=1. In this evaluation method, the detection signal D1 and the stimulation signal S1 are therefore used.

The signal amplitude evaluation method comprises an assessment of the signal amplitudes of the detection signal D1. This method is less computationally intensive. In the ideal instance, each recorded period of the detection signal D1 would have the same signal amplitude. However, in the event that the stimulation signal S1 has been impaired by interference sources, the measured values for the signal amplitude of the detection signal D1 vary. If the difference between the maximum and minimum recorded signal amplitude is calculated, this value can be interpreted as a measure of the effect of the interference. Given a low signal amplitude difference, a signal quality indicator SI near the value=1 is thus determined. In this evaluation method, the detection signal D1 and the stimulation signal S1 are therefore used.

In a further step, a conductivity signal L1 corresponding to the detection signal D1 is determined based on the detection signal D1. A signal-typical characteristic value of the detection signal D1 is hereby converted into a corresponding value of the conductivity signal L1 by means of a formula known to the person skilled in the art and a sensor element-specific cell constant. This signal-typical characteristic value could be, for example, the amplitude, the effective value, or the rectified value of the detection signal.

The conductivity signal L1 is subsequently stored in the storage module 5 of the control unit 4. A later processing or evaluation of the conductivity signal L1 is thus possible.

In a further step, a dynamic factor DF based on the conductivity signal L1 is determined by the control unit 4. The step of determining the dynamic factor DF comprises a comparison of a mean value of the conductivity signal L1 stored in the storage module 5 with the most recent conductivity value of the conductivity signal L1, wherein the dynamic factor DF maps a current rate of change of the conductivity signal L1. "Most recent" here means a chronologically last determined value.

In a next step, the filtering of the conductivity signal L1 takes place using a filter function FF depending on the determined signal quality indicator SI and the determined dynamic factor DF.

The filter function FF preferably comprises a moving average filtering. Alternatively or complementary to the moving average filtering, the filter function FF comprises an exponential filtering or FIR or IIR filtering.

The filter function FF filters the conductivity signal L1 over a first time span Z1 or a first number A1 of measured values MW of the conductivity signal L1. The first time span Z1 is, for example, 10 seconds long. The first number A comprises, for example, 30 measured values.

The first time span Z1 or the first number A1 is varied depending on the signal quality indicator SI and the dynamic factor DF. Given a poor signal quality, thus if the signal quality indicator SI is less than or equal to a threshold SW, a strong filtering takes place. Given a good signal quality, thus if the signal quality indicator SI is greater than the threshold SW, a normal filtering takes place (see FIG. 1).

If the signal quality indicator SI is less than or equal to the threshold SW, for example less than or equal to 0.5, and if the dynamic factor DF is less than a first limit value G1, the first time span Z1 or the first number A1 of measured values for the filter function FF remains the same. The first limit value G1 is, for example, 16%. This means that the most recent measured conductivity value of the conductivity signal L1 deviates by 16% from the mean value of the previously considered measured conductivity values of the conductivity signal L1.

However, if the dynamic factor DF is between the first limit value G1 and a second limit value G2, the first time span Z1 or the first number A1 of measured values MW for the filter function FF is reduced by a first reduction proportion RA1, for example 20%, thus for example by 2 seconds or 6 measured values (at a sampling frequency of 3 Hz). The second limit value G2 is, for example, 24%. The reduction of the first time span Z1 or the reduction of the measured values which are taken into consideration for the filter function FF takes place in that the oldest measured values are discarded; the first time span Z1 is thus, for example, only 8 seconds long and comprises, for example, only 24 measured values (at a sampling frequency of 3 Hz).

If the dynamic factor DF is between the second limit value G2 and a third limit value G3, the first time span Z1 or the first number A1 of measured values MW for the filter function FF is reduced by a second reduction proportion RA2, for example 30%, thus, for example, by 3 seconds or 9 measured values (at a sampling frequency of 3 Hz). The third limit value G3 is, for example, 28%.

If the signal quality indicator SI is greater than the threshold SW, for example greater than 0.5, and if the dynamic factor DF is less than a fourth limit value, the first time span Z1 or the first number A1 of measured values MW remains the same. The fourth limit value G4 is, for example, 2%. This means that the most recent measured conductivity value differs only by 2% from the average of the considered past measured conductivity values.

If the dynamic factor DF is between the fourth limit value G4 and a fifth limit value G5, the first time span Z1 or the first number A1 of measured values MW for the filter function FF is reduced by a third reduction proportion RA3, for example 20%, thus, for example, by 2 seconds or 6 measured values (at a sampling frequency of 3 Hz). The fifth limit value G5 is, for example, 3%.

If the dynamic factor DF is between the fifth limit value G5 and a sixth limit value G6, the first time span Z1, or the first number A1 of measured values MW for the filter function FF is reduced by a fourth reduction proportion RA4, for example 30%, thus, for example, by 3 seconds or 9 measured values (at a sampling frequency of 3 Hz). The sixth limit value G6 is, for example, 4%.

Any number of limit values and associated reductions or reduction proportions of the time span or of the number of measured values can be selected. If the dynamic factor is high, it is likewise possible to reduce the first number A1 of measured values MW for the filter function by 100%.

Of course, it is also possible to select the aforementioned threshold SW or the aforementioned limit values differently than specified, provided that the limit values are increased if a signal quality indicator SI reveals a signal disturbance. It is thus achieved that the mean value filter is adjusted to be more tolerant given a strong interfering influence, whereby a low-noise output signal is ensured even in the event of a disturbed measurement.

In a further step, the outputting of the filtered measured value MW of the filtered conductivity signal takes place. The filtered measured value MW is, for example, the mean value of the conductivity signal L1, which was determined by the filter function FF.

The output takes place, for example, by an indication on a display (not shown) or by transmission of the measured value MW by a communication unit (not shown) to a user interface.

The invention claimed is:

1. A method for determining a conductivity value of a measurement medium using a conductivity sensor, the method comprising the following steps:
   providing a conductivity sensor with at least one transmitting unit, at least one receiving unit, and a control unit having a storage module;
   transmitting a stimulation signal into the measurement medium at the transmitting unit by the control unit;
   receiving a detection signal at the receiving unit;

determining a signal quality indicator by the control unit based on the detection signal;
determining a conductivity signal corresponding to the detection signal;
storing the conductivity signal;
determining a dynamic factor by the control unit based on the conductivity signal;
filtering the conductivity signal using a filter function based on the determined signal quality indicator and the dynamic factor; and
outputting a filtered measured value of the filtered conductivity signal.

2. The method of claim 1, wherein the step of determining the signal quality indicator comprises an assessment of a distortion of the detection signal compared to the stimulation signal using at least one evaluation method from the following group:
   a total harmonic distortion evaluation method,
   a cross-correlation evaluation method,
   a fast Fourier transform evaluation method, and
   a signal amplitude evaluation method.

3. The method of claim 1, wherein the step of determining the dynamic factor comprises a comparison of a mean value of the stored conductivity signal with the most recent conductivity value of the conductivity signal, wherein the dynamic factor maps a current rate of change of the conductivity signal.

4. The method of claim 1, wherein the filter function filters the conductivity signal over a first time span or a first number of measured values of the conductivity signal, wherein the first time span or the first number is varied depending on the signal quality indicator and the dynamic factor.

5. The method of claim 4, wherein:
   if the signal quality indicator is less than a threshold and if the dynamic factor is less than a first threshold value, the first time span or the first number of measured values for the filter function remains the same;
   if the dynamic factor is between the first limit value and a second limit value, the first time span or the first number of measured values for the filter function is reduced by a first reduction proportion; and
   if the dynamic factor is between the second limit value and a third limit value, the first time span or the first number of measured values for the filter function is reduced by a second reduction proportion.

6. The method of claim 5, wherein:
   if the signal quality indicator is greater than the threshold and if the dynamic factor is less than a fourth limit value, the first time span or the first number of measured values remains the same;
   if the dynamic factor is between the fourth limit value and a fifth limit value, the first time span or the first number of measured values for the filter function is reduced by a third reduction proportion; and
   if the dynamic factor is between the fifth limit value and a sixth limit value, the first time span or the first number of measured values for the filter function is reduced by a fourth reduction proportion.

7. The method of claim 1, wherein the filter function includes a moving average filtering.

8. The method of claim 1, wherein the stimulation signal is a periodic alternating current signal or an AC voltage signal.

9. A conductivity sensor, comprising:
   at least one transmitting unit;
   at least one receiving unit; and
   a control unit having a storage module;
      wherein the control unit is configured for executing the following method:
         transmitting a stimulation signal into the measurement medium at the transmitting unit by the control unit;
      receiving a detection signal at the receiving unit;
      determining a signal quality indicator by the control unit based on the detection signal;
      determining a conductivity signal corresponding to the detection signal;
      storing the conductivity signal;
      determining a dynamic factor by the control unit based on the conductivity signal;
      filtering the conductivity signal using a filter function based on the determined signal quality indicator and the dynamic factor; and
      outputting a filtered measured value of the filtered conductivity signal.

* * * * *